(12) United States Patent
Ravesi

(10) Patent No.: US 6,503,823 B1
(45) Date of Patent: Jan. 7, 2003

(54) METHOD FOR MANUFACTURING CAPACITOR ELEMENTS ON A SEMICONDUCTOR SUBSTRATE

(75) Inventor: Sebastiano Ravesi, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/626,005

(22) Filed: Jul. 26, 2000

(30) Foreign Application Priority Data

Jul. 30, 1999 (EP) .............................................. 99830492

(51) Int. Cl.⁷ .......................................... H01L 21/4763
(52) U.S. Cl. ....................................... 438/622; 438/643
(58) Field of Search .................................. 438/622, 643

(56) References Cited

U.S. PATENT DOCUMENTS

| | | | |
|---|---|---|---|
| 5,219,787 A | 6/1993 | Carey et al. ................. | 437/187 |
| 5,741,721 A | * 4/1998 | Stevens ........................ | 437/60 |
| 6,242,299 B1 | * 6/2001 | Hickert ........................ | 438/240 |

FOREIGN PATENT DOCUMENTS

| | | | |
|---|---|---|---|
| EP | 0 771 022 A3 | 5/1997 | ....... H01L/21/3205 |
| EP | 0 771 022 A2 | 5/1997 | ....... H01L/21/3205 |

\* cited by examiner

*Primary Examiner*—David Nelms
*Assistant Examiner*—Reneé R Berry
(74) *Attorney, Agent, or Firm*—Lisa K. Jorgenson; Allen, Dyer, Doppelt, Milbrath & Gilchrist, P.A.

(57) ABSTRACT

A method for manufacturing integrated capacitive elements on a semiconductor substrate includes depositing a first metallization layer on a first dielectric layer. The first metallization layer includes a lower plate for a capacitive element and an interconnection pad. The method further includes forming a second dielectric layer over the first dielectric layer, forming a first opening aligned with the lower plate through the second dielectric layer, and depositing a third dielectric layer on the second dielectric layer and the lower plate and covering sidewalls of the first opening. A second opening is formed through the third dielectric layer and aligned with the interconnection pad. A fourth dielectric layer is deposited on the whole wafer surface, wherein the fourth dielectric layer is etchable in a completely selective manner relative to the third dielectric layer. If the fourth dielectric layer were not etchable relative to the second dielectric layer, the second dielectric layer might be destroyed or damaged during the formation of the pad opening, thereby compromising the operability of the capacitive element.

26 Claims, 6 Drawing Sheets

METHOD FOR MANUFACTURING CAPACITOR ELEMENTS ON A SEMICONDUCTOR SUBSTRATE

FIELD OF THE INVENTION

The present invention relates to the field of semiconductor processing, and, more particularly, to a method for manufacturing integrated capacitive elements.

BACKGROUND OF THE INVENTION

Capacitive elements are passive components commonly used in integrated electronic circuits. A known technique for integrating metal plate capacitors on a semiconductor substrate includes the formation, after an oxide layer has been formed on the semiconductor substrate, of a metallization layer over the oxide layer. The metallization layer is patterned to provide the lower plates of the capacitive elements and any interconnection pads.

A thin lower dielectric layer is then deposited over the entire exposed surface and is intended to provide the dielectric layer separating the plates of the capacitive elements. The portions of the lower dielectric layer which overlie the metallization pads are removed by a photolithographic process. This later allows the interconnection of pads to the next metallization layer.

An upper dielectric layer is then deposited over the entire wafer surface. Subsequently, openings are formed through this dielectric layer aligned with the metallization pads and the lower dielectric layer overlying the lower plates. The upper dielectric layer has to be etchable in a completely selective manner relative to the lower dielectric layer. If the upper dielectric layer were not etchable relative to the lower dielectric layer, the lower dielectric layer might be destroyed or damaged during the formation of the contact openings, thereby compromising the operability of the capacitive elements.

The manufacturing of the capacitive elements is completed by the deposition and subsequent photolithographic definition of the next metallization level. The last-mentioned step defines the upper plates of the capacitive elements and the interconnection to the lower metallization level through the openings.

Although in many ways advantageous, the above manufacturing method includes depositing an oxide layer which is used to provide the dielectric layer between the plates of the capacitive elements. The oxide layer must have adequate characteristics to ensure functional capacitors. Consequently, the oxide layer must be suitably provided and formed in standard manufacturing schemes.

SUMMARY OF THE INVENTION

Embodiments of the present invention provide a method for manufacturing capacitive elements, in particular, high-capacitance capacitors having structural and functional features that are integratable to processes for manufacturing semiconductor-integrated electronic devices. This is done without modifying the various steps of the manufacturing processes, thereby overcoming the drawbacks of prior art processes for manufacturing capacitive elements.

Embodiments of the invention produce the aforementioned integrated capacitive elements by the very steps of a conventional process for forming interconnections in integrated circuits, in particular, a process known as "dual damascene". More particularly, the method of this invention provides two layers of an insulating material distinguishable from each other during the removing and etching steps carried out within the multi-level interconnection scheme.

The invention specifically relates to a method for manufacturing capacitive elements on a semiconductor substrate, preferably comprising forming a first dielectric layer over the semiconductor substrate; depositing a first metallization layer on the first dielectric layer; defining the first metallization layer to provide lower plates of capacitive elements and interconnection pads in the first dielectric layer; and forming a second dielectric layer over the first dielectric layer.

The invention particularly, but not exclusively, relates to a method for manufacturing capacitive elements of high capacitance which are interposed between successive metallization levels within a multi-level connection structure, implementing in particular, the "dual damascene" interconnection scheme, and the description which follows will make reference to such a field of application for simplicity of illustration.

DETAILED DESCRIPTION OF THE PREFERRED EMBODIMENTS

Figure 1:
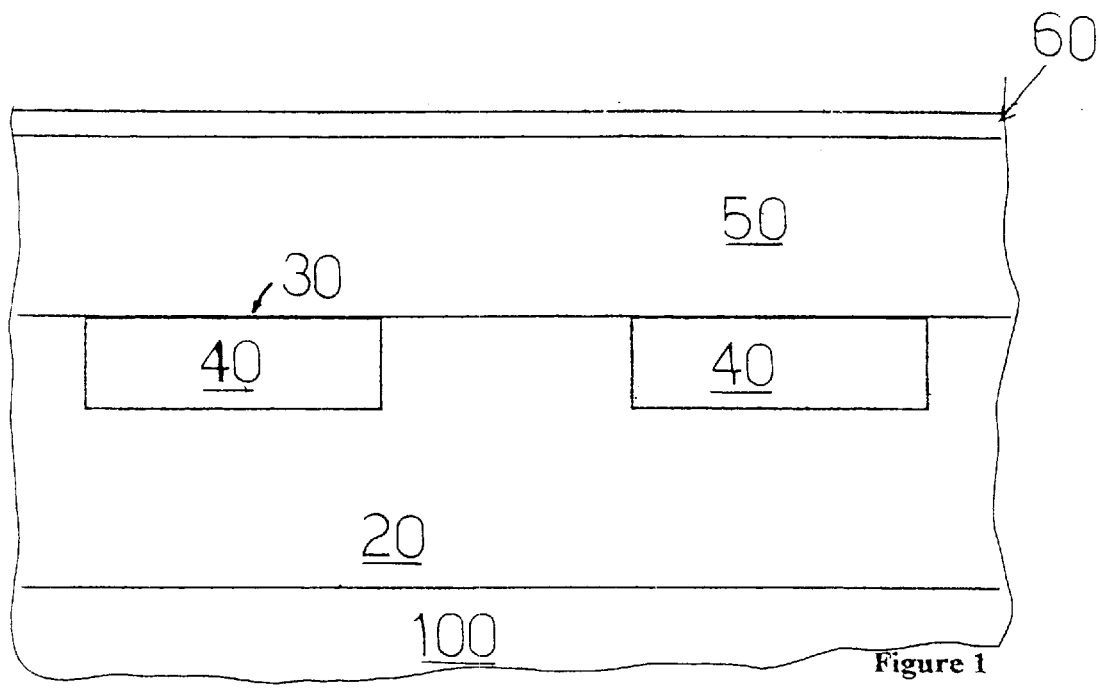
FIGS. 1–5 are vertical cross-sectional views schematically showing a portion of a semiconductor substrate wherein an interconnection structure has been formed according to the prior art.

Referring to FIGS. 1 to 5, an interconnection scheme known as "dual damascene", which is currently used to provide interconnections in integrated circuits, will be described first. A first dielectric layer 20 is formed over a semiconductor substrate 100. A metallization layer 30 is then formed over the dielectric layer 20 and patterned to provide a plurality of plates or pads 40 in the first dielectric layer 20. A second dielectric layer 50, and a third dielectric layer 60 known as the etch stop layer, are then deposited successively as shown in FIG. 1.

Figure 3:
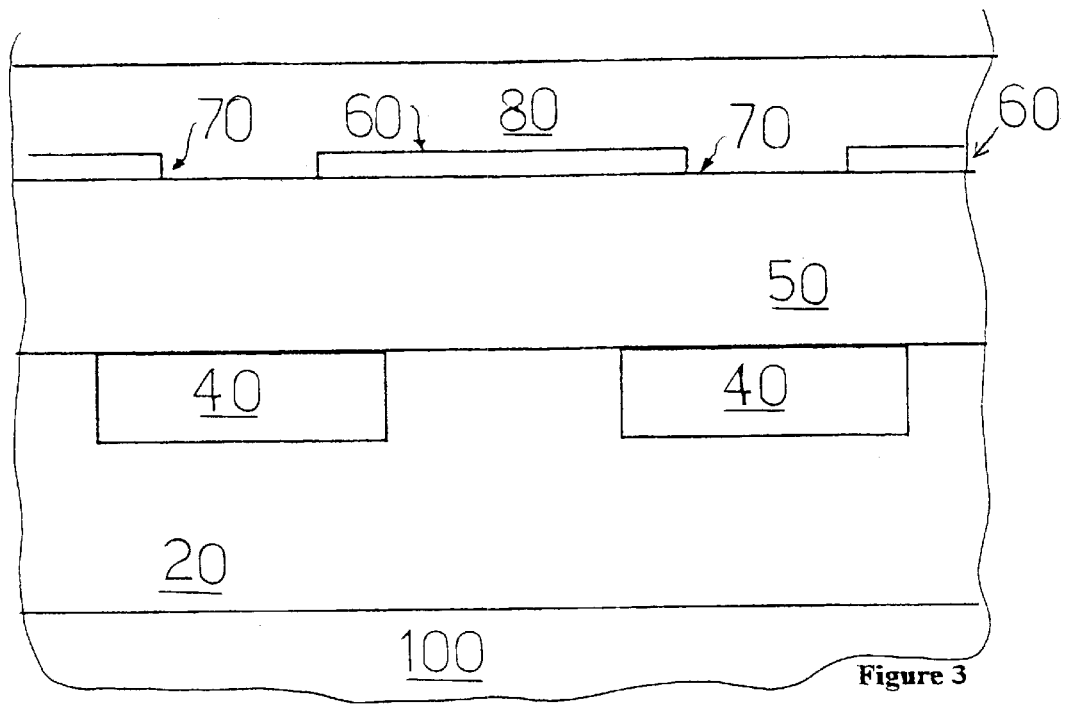

Using a conventional photolithographic process, a first opening 70 is formed through the dielectric layer 60 aligned with the underlying pad 40 which will serve for interconnecting the successive metallization layers. As shown in FIG. 3, a fourth dielectric layer 80, identical with the second dielectric layer 50, is then deposited.

A second opening 90 (FIG. 4) is then formed by a single masking step whereby openings 110 are defined larger than the openings 70. During the etching operation for forming the second openings 90, the fourth dielectric layer 80 is first removed. Thereafter, utilizing the complete selectivity of this etch relative to the third dielectric layer 60, the etching is continued through the second dielectric layer 50 and stopped at the surface of the underlying pad 40.

A second metallization layer 120 is then deposited to provide the interconnection (FIG. 5) to the pad 40 through the openings 130. This metallization layer 120 is then subjected to an etchback or chemical mechanical polishing (CMP) step to locate it within the overall dielectric layer comprised of the second, third and fourth dielectric layer. The above process flow is used to implement a multi-level interconnection scheme.

Advantageously, a method for manufacturing capacitive elements integrated on a semiconductor substrate 1 which comprises the previously described process steps for providing interconnections will now be described with reference to FIGS. 6–12.

The present invention can be practiced with integrated circuit manufacturing techniques currently in use by the industry. Commonly used process steps necessary for understanding this invention will be discussed. The figures that show cross-sections through portions of an integrated circuit during its manufacturing process are not drawn to scale, but rather to highlight major features of the invention.

A first dielectric layer 2 is formed on a semiconductor substrate 1. The total thickness of this first dielectric layer 2 is the sum of the individual thickness of the silicon oxide layers, and the dielectrics between successive metallization levels. These oxide layers have been grown by various thermal oxidation operations carried out during the manufacturing of the elementary devices used in standard integrated circuits.

Advantageously, the larger the thickness of this first total dielectric layer 2, the smaller becomes its dielectric permittivity and the higher the ratio of the capacitor C (FIG. 12) of its own capacitance to the parasitic capacitance toward the substrate.

Using conventional manufacturing steps, a plurality of plates 4 are defined in this first dielectric layer 2 which will function as the lower plate of the capacitors. A plurality of interconnection pads 5 are also defined which will be used for interconnecting devices or functional blocks provided in the integrated circuit for connecting to the next metallization layer.

Advantageously, the plates 4 and pads 5 are formed in the same first metallization layer 3. In particular, this first metallization layer 3 may belong to an intermediate metallization layer, and is not required to be the first metallization layer formed in the integrated circuit. Once the plates 4 and pads 5 are formed, a second dielectric layer 6 is deposited.

Figure 7:
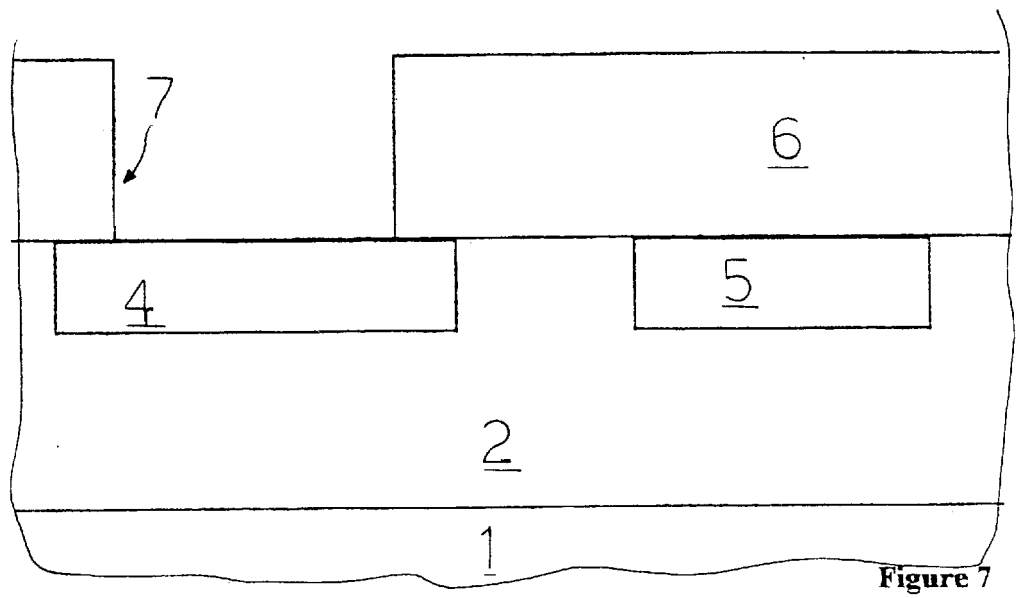

The next manufacturing step comprises the formation of first openings 7 through the second dielectric layer 6 which are only aligned with the plates 4. A plate 4 will be used as the lower plate of a capacitor that will be formed, as shown in FIG. 7.

Figure 8:
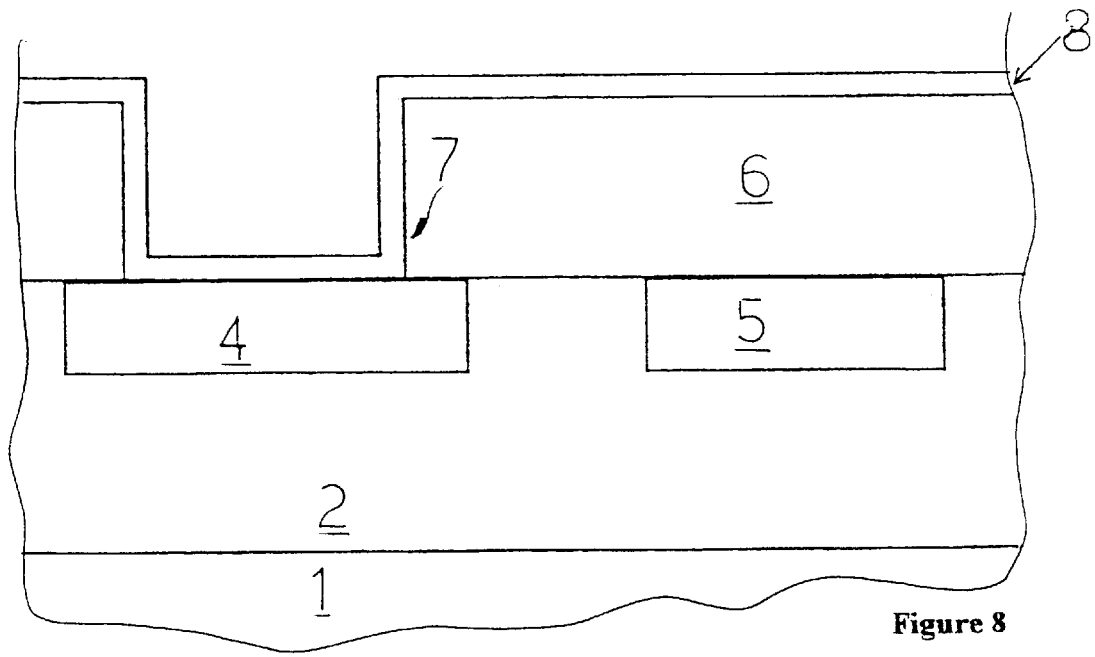

The method steps now follow a standard scheme with standard dual damascene processes. That is, a third dielectric layer 8, known as the etch stop layer, is deposited on top of the second dielectric layer 6, as shown in FIG. 8. This third dielectric layer 8 has, in the method of this invention, an important dielectric function for the capacitive element C.

Advantageously, this third dielectric layer 8 can be deposited using reduced thermal budget processes which are compatible with the underlying metal films. This third dielectric layer 8 has good adherence on metal and high electric permittivity, thereby allowing capacitors C of high specific capacitance to be manufactured. In addition, this third dielectric layer 8 is made from high dielectric strength materials.

The thickness of the third dielectric layer 8 should be adequate to ensure a higher specific capacitance, and therefore, should be the thinnest to do so, but sufficiently strong so as not to impair functionality in the course of subsequent method steps to be applied thereto. The third dielectric layer 8 should be deposited to a conforming or even thickness, even at the edge of the lower plate 4 of the capacitor that has been defined by the previous method for providing the opening 7 through the second dielectric layer 6.

Advantageously, this third dielectric layer 8 is formed from materials of high dielectric permittivity, such as tantalum or titanium oxide and strontium and barium/strontium titanates, obtained by chemical vapor deposition from metal-organic precursors.

Figure 9:
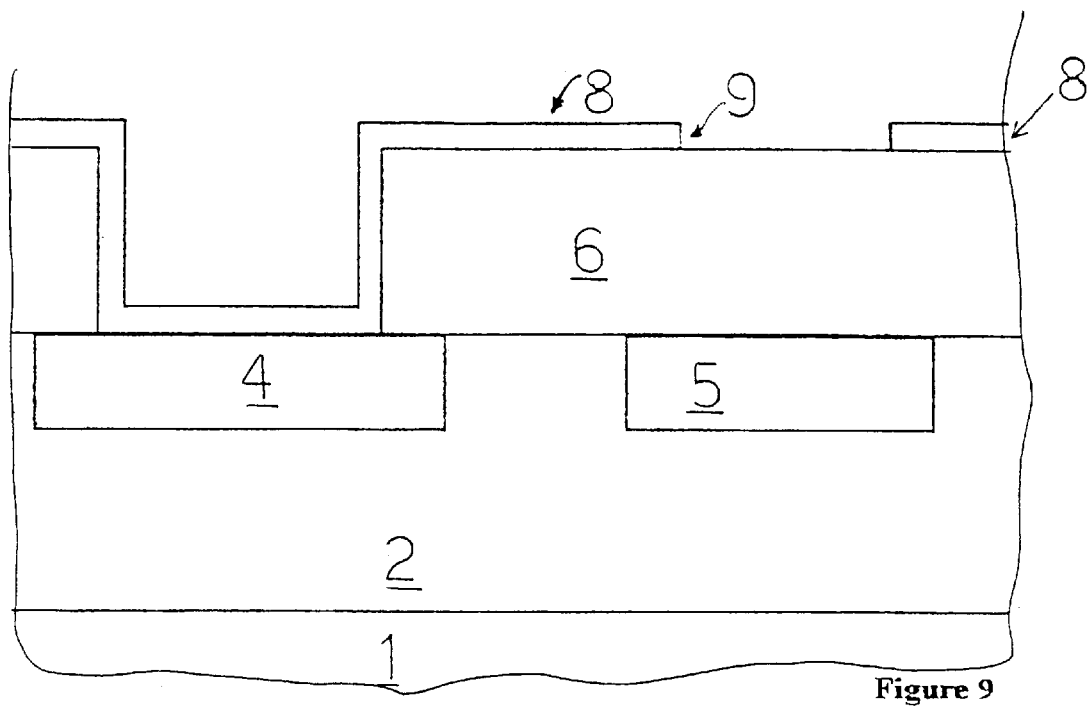
Figure 10:
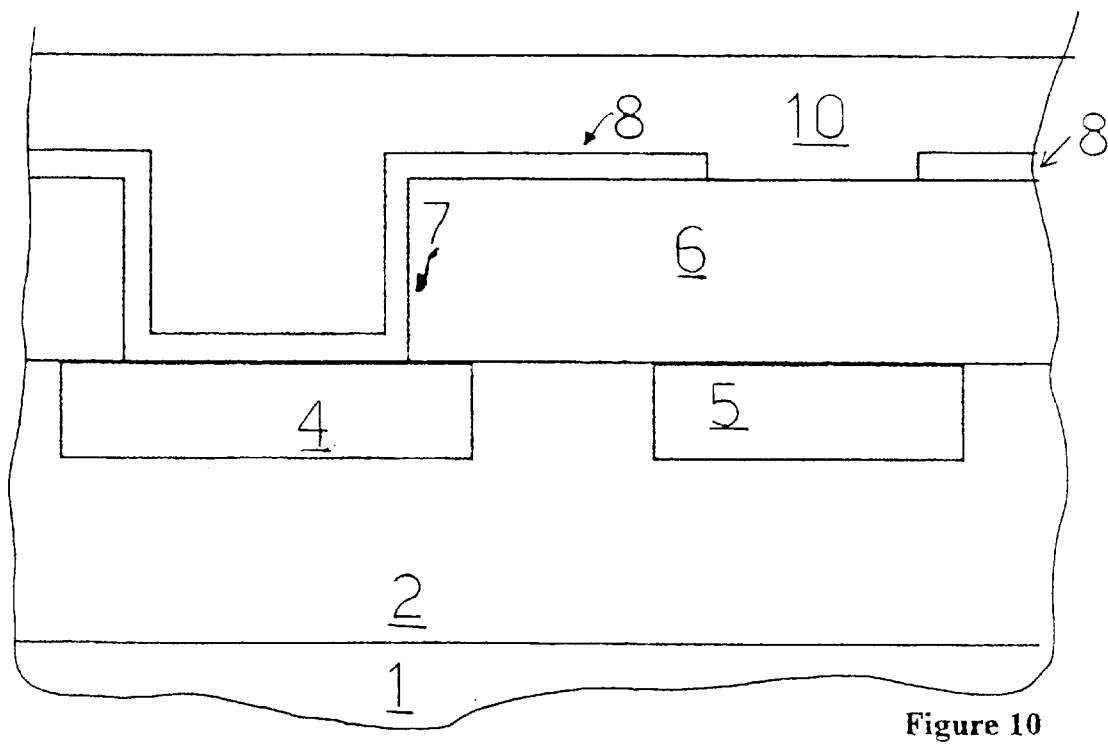

As shown in FIG. 9, the next method step includes comprises forming second openings 9 using conventional etching through this third dielectric layer 8. These second openings 9 are aligned with the underlying pad 5, whereby the interconnection to the next metallization layer will be established. A fourth dielectric layer 10 is then deposited over the entire wafer surface.

Advantageously, this fourth dielectric layer 10 is formed from a material which can remove or attenuate the presence of steps at the wafer surface, is compatible in the process with the underlying structure, and has good adherence on the layer beneath. Furthermore, this fourth dielectric layer 10 is "etchable" in a completely selective manner with respect to the third dielectric layer 8 as provided by the dual damascene scheme.

Figure 11:
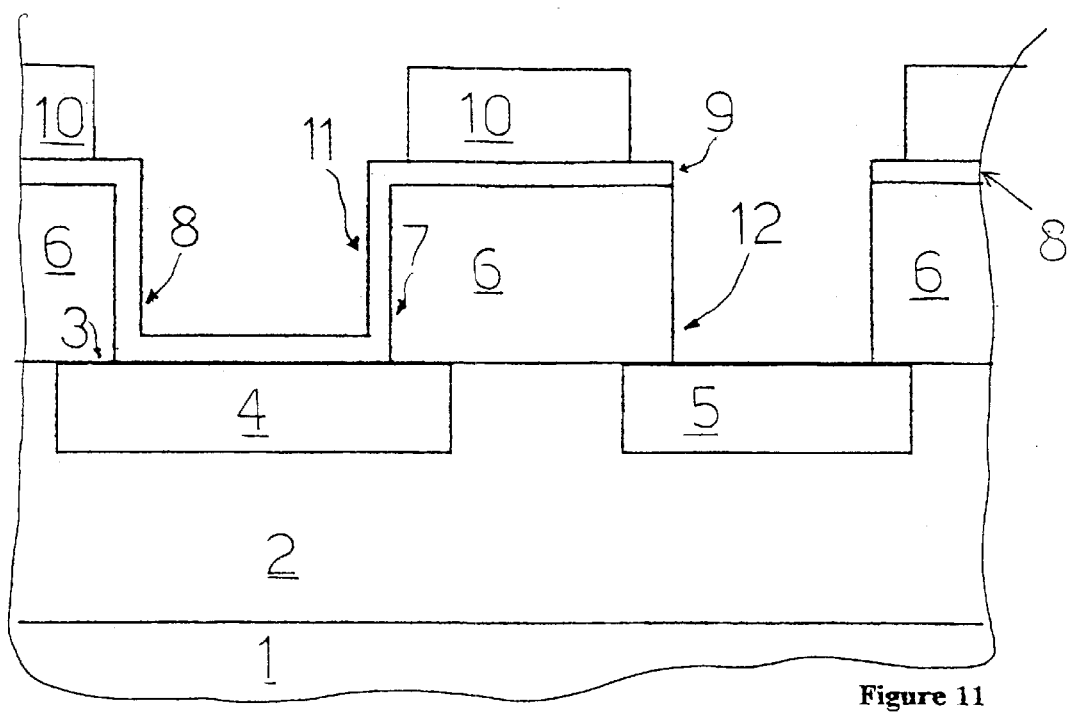

The next manufacturing step comprises forming third openings 11 through the fourth dielectric layer 6 aligned with the plates 4 which will be used as the lower plate of a capacitor that will be formed, and fourth openings 12 through the fourth dielectric layer 6 aligned with the second openings 9, as shown in FIG. 11.

Advantageously, these fourth openings 12 are larger than the second openings 9. Advantageously, by utilizing the complete selectivity of the fourth dielectric layer 10 with the third dielectric layer 8, and where the second dielectric layer 6 is made from the same material as the fourth dielectric layer 10, the etching of the fourth dielectric layer 10 is continued through the second dielectric layer, and the fourth opening 12 reaches the pad 5.

Figure 12:
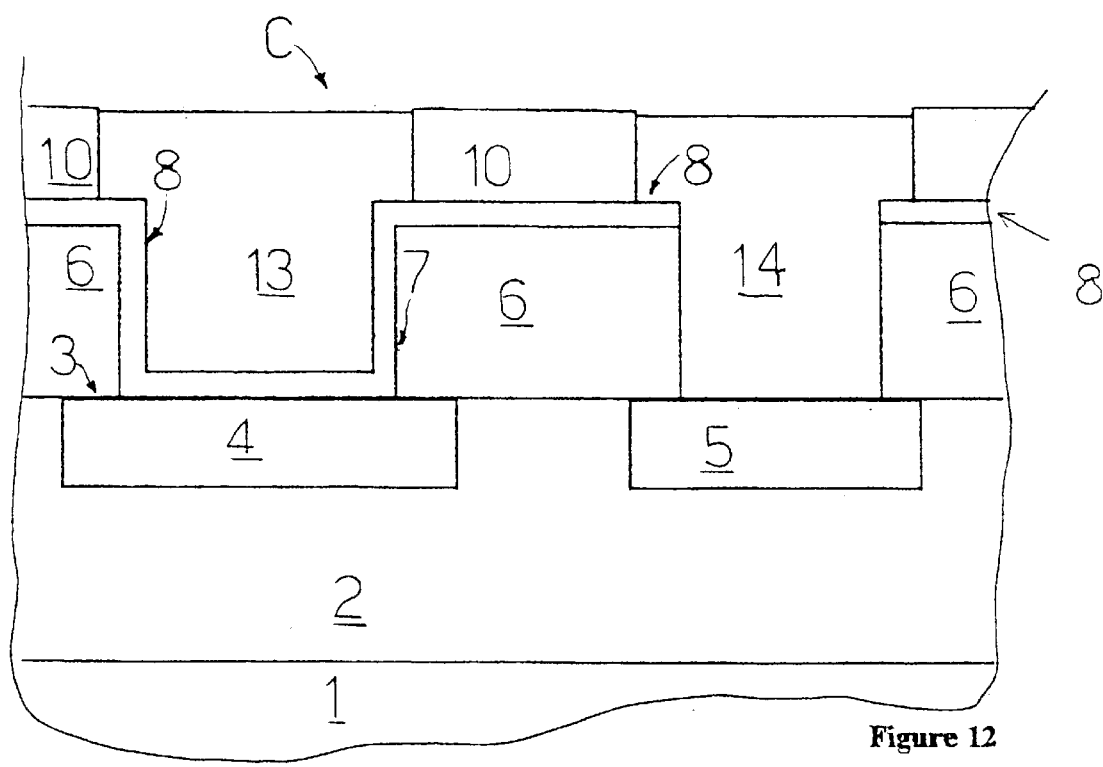

The manufacturing of the capacitors C is completed by the deposition and definition of a second metallization layer 12 by an etchback or CMP step, as shown in FIG. 12. The last-mentioned method step defines an upper plate 14 of the capacitor C and an interconnection to the first metallization layer 3 through the fourth openings.

To summarize, in the method according to embodiments of the present invention, the requirement for the fourth dielectric layer to be "etchable" in a completely selective manner relative to the third dielectric layer 8 is also essential to the operability of the capacitors. If this requirement is not met, during the step of forming the third openings 11 through the fourth dielectric layer (FIG. 10), the third dielectric layer 8 would be destroyed or damaged, and thus compromising the operability of the capacitors C.

In standard processes, this feature imposes an additional burden on the integrated circuit manufacturing process. This feature is instead provided implicitly by the dual damascene interconnection scheme.

Advantageously, suitable materials for this fourth dielectric layer 10 are those having an organic base and being deposited by a spin-on method, both on account of this deposition technique being well established and compatible. Also, suitable materials are etchable with an $O_2$-based chemistry which is selective with respect to the etch stop layers 8 previously proposed.

Another characteristics that makes the use of such materials attractive is their low dielectric permittivity, which minimizes parasitic capacitances and interference between adjacent tracks and metal levels. For the purpose, an appropriate choice of the thickness ratio between the fourth dielectric layer 10 and the third dielectric layer 8 can minimize the adverse effect on the interconnection by the high dielectric permittivity required of the last-mentioned layer.

That which is claimed is:

1. A method for manufacturing a capacitive element integrated on a semiconductor substrate, the method comprising:
   forming a first dielectric layer on the semiconductor substrate;
   forming a first metallization layer on the first dielectric layer to include a lower plate of the capacitive element and an interconnection pad therein;
   forming a second dielectric layer over the first dielectric layer and at least a portion of the first metallization layer;
   forming a first opening through the second dielectric layer and aligned with the lower plate;
   forming a third dielectric layer on the second dielectric layer and the lower plate and covering sidewalls of the first opening;
   forming a second opening through the third dielectric layer and aligned with the interconnection pad;
   forming a fourth dielectric layer on the second dielectric layer and the third dielectric layer, the fourth dielectric layer being selectively etchable relative to the third dielectric layer;
   forming a third opening through the fourth dielectric layer to the third dielectric layer and aligned with the lower plate;
   forming a fourth opening through the fourth dielectric layer and through the second dielectric layer to the interconnection pad, the fourth opening being aligned with the second opening; and
   forming a second metallization layer in the third and fourth openings to respectively provide an upper plate for the capacitive element and an interconnection to the interconnection pad.

2. A method according to claim 1, wherein the second and fourth dielectric layers comprise the same material.

3. A method according to claim 1, further comprising planarizing the respective first and second metallization layers.

4. A method according to claim 1, wherein the fourth opening has a larger diameter than a diameter of the second opening.

5. A method according to claim 1, wherein the third dielectric layer comprises a conforming oxide.

6. A method according to claim 1, wherein the third dielectric layer comprises at least one of tantalum and titanium oxide.

7. A method according to claim 1, wherein the third dielectric layer comprises at least one of strontium and barium/strontium titanate.

8. A method according to claim 1, wherein the fourth dielectric layer comprises an organic base material.

9. A method for manufacturing a capacitive element integrated on a semiconductor substrate, the method comprising:
   forming a first metallization layer on a first dielectric layer to include a lower plate of the capacitive element and an interconnection pad therein;
   forming a second dielectric layer over the first dielectric layer and at least a portion of the first metallization layer;
   forming a first opening through the second dielectric layer and aligned with the lower plate;
   forming a third dielectric layer on the second dielectric layer and the lower plate and covering sidewalls of the first opening;
   forming a second opening through the third dielectric layer and aligned with the interconnection pad; and
   forming a fourth dielectric layer on the second dielectric layer and the third dielectric layer, the fourth dielectric layer being selectively etchable relative to the third dielectric layer.

10. A method according to claim 9, further comprising:
    forming a third opening through the fourth dielectric layer to the third dielectric layer and aligned with the lower plate; and
    forming a fourth opening through the fourth dielectric layer and through the second dielectric layer to the interconnection pad, the fourth opening being aligned with the second opening.

11. A method according to claim 10, further comprising forming a second metallization layer in the third and fourth openings to respectively provide an upper plate for the capacitive element and an interconnection to the interconnection pad.

12. A method according to claim 9, further comprising forming the first dielectric layer on the semiconductor substrate.

13. A method according to claim 9, wherein the second and fourth dielectric layers comprise the same material.

14. A method according to claim 9, further comprising planarizing the respective first and second metallization layers.

15. A method according to claim 9, wherein the fourth opening has a larger diameter than a diameter of the second opening.

16. A method according to claim 9, wherein the third dielectric layer comprises a conforming oxide.

17. A method according to claim 9, wherein the third dielectric layer comprises at least one of tantalum and titanium oxide.

18. A method according to claim 9, wherein the third dielectric layer comprises at least one of strontium and barium/strontium titanate.

19. A method according to claim 9, wherein the fourth dielectric layer comprises an organic base material.

20. A capacitive element and an interconnection pad on a semiconductor substrate comprising:
    a semiconductor substrate;
    a first dielectric layer on said semiconductor substrate;
    a first metallization layer on said first dielectric layer defining a lower plate of the capacitive element and the interconnection pad;
    a second dielectric layer on said first dielectric layer and at least a portion of said first metallization layer, said second dielectric layer having a first opening aligned with the lower plate;
    a third dielectric layer on said second dielectric layer and the lower plate and covering sidewalls of the first opening, said third dielectric layer having a second opening aligned with the interconnection pad;
    a fourth dielectric layer on said third dielectric layer and having a third opening to said third dielectric layer and aligned with the lower plate, and having a fourth opening to the interconnection pad and aligned with the second opening, said fourth dielectric layer being selectively etchable relative to said third dielectric layer; and a second metallization layer in the third and fourth openings to respectively provide an upper plate for the capacitive element and an interconnection to the interconnection pad.

21. A capacitive element and an interconnection pad according to claim 20, wherein said second and fourth dielectric layers comprise the same material.

22. A capacitive element and an interconnection pad according to claim 20, wherein the fourth opening has a larger diameter than a diameter of the second opening.

23. A capacitive element and an interconnection pad according to claim 20, wherein said third dielectric layer comprises a conforming oxide.

24. A capacitive element and an interconnection pad according to claim 20, wherein said third dielectric layer comprises at least one of tantalum and titanium oxide.

25. A capacitive element and an interconnection pad according to claim 20, wherein said third dielectric layer comprises at least one of strontium and barium/strontium titanate.

26. A capacitive element and an interconnection pad according to claim 20, wherein said fourth dielectric layer comprises an organic base material.

* * * * *

UNITED STATES PATENT AND TRADEMARK OFFICE
CERTIFICATE OF CORRECTION

Figure 2:
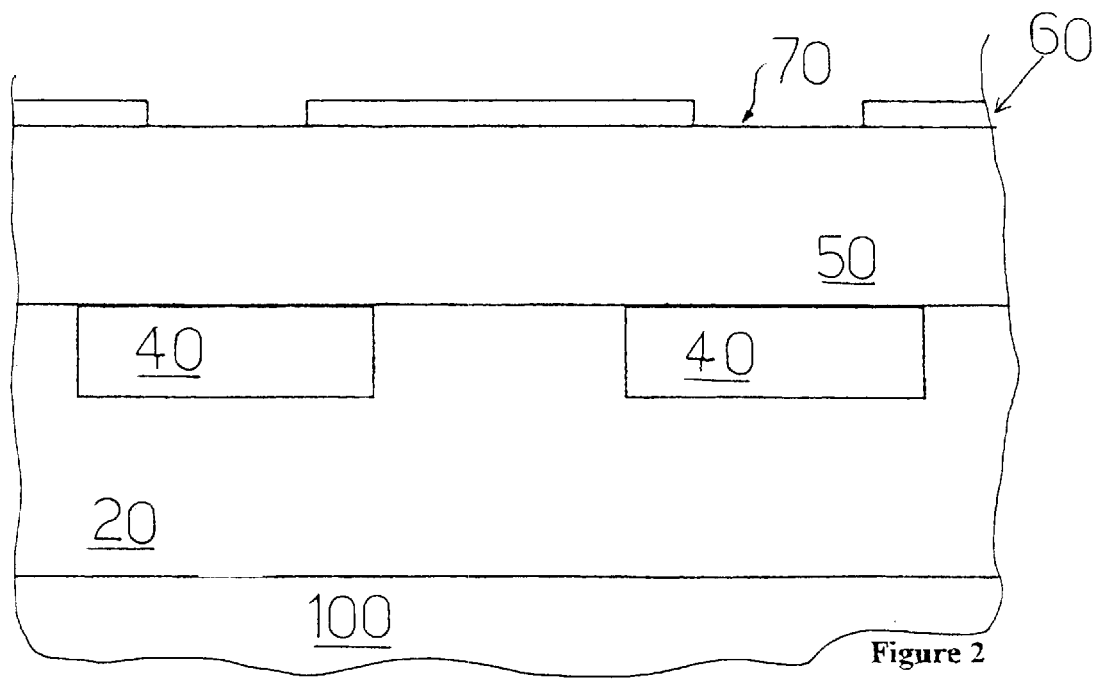

PATENT NO. : 6,503,823 B1  Page 1 of 2
DATED : January 7, 2003
INVENTOR(S) : Sebastiano Ravesi It is certified that error appears in the above-identified patent and that said Letters Patent is hereby corrected as shown below:

<u>Drawings,</u>
Sheet 1 of 6, delete "FIGS. 1 and 2" insert:

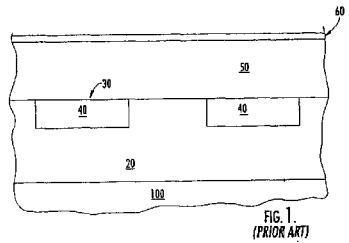

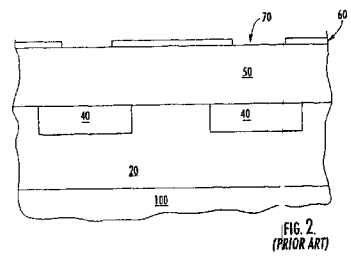

Figure 4:
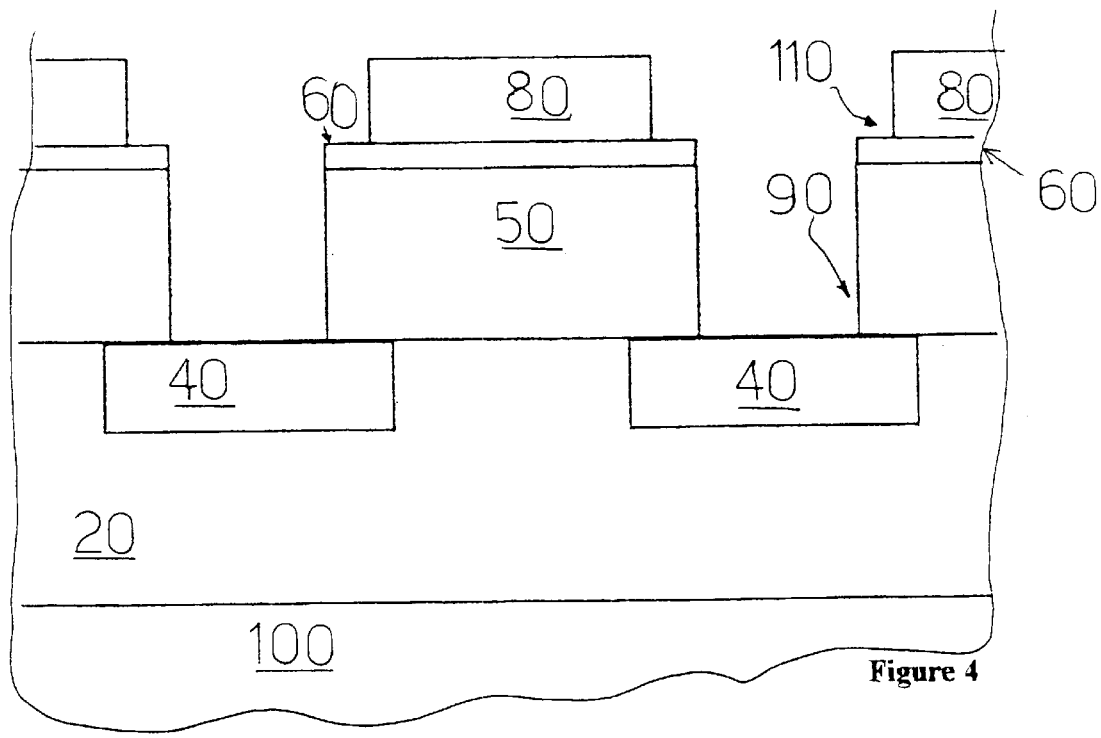

Sheet 2 of 6, delete "FIGS. 3 and 4" insert:

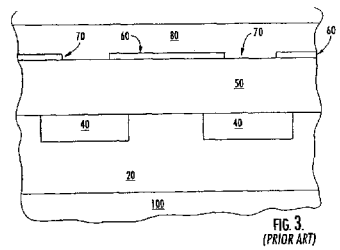

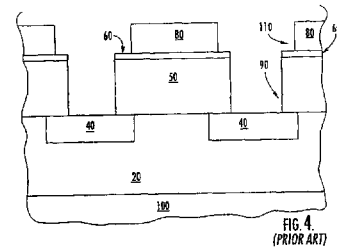

UNITED STATES PATENT AND TRADEMARK OFFICE
CERTIFICATE OF CORRECTION

Figure 5:
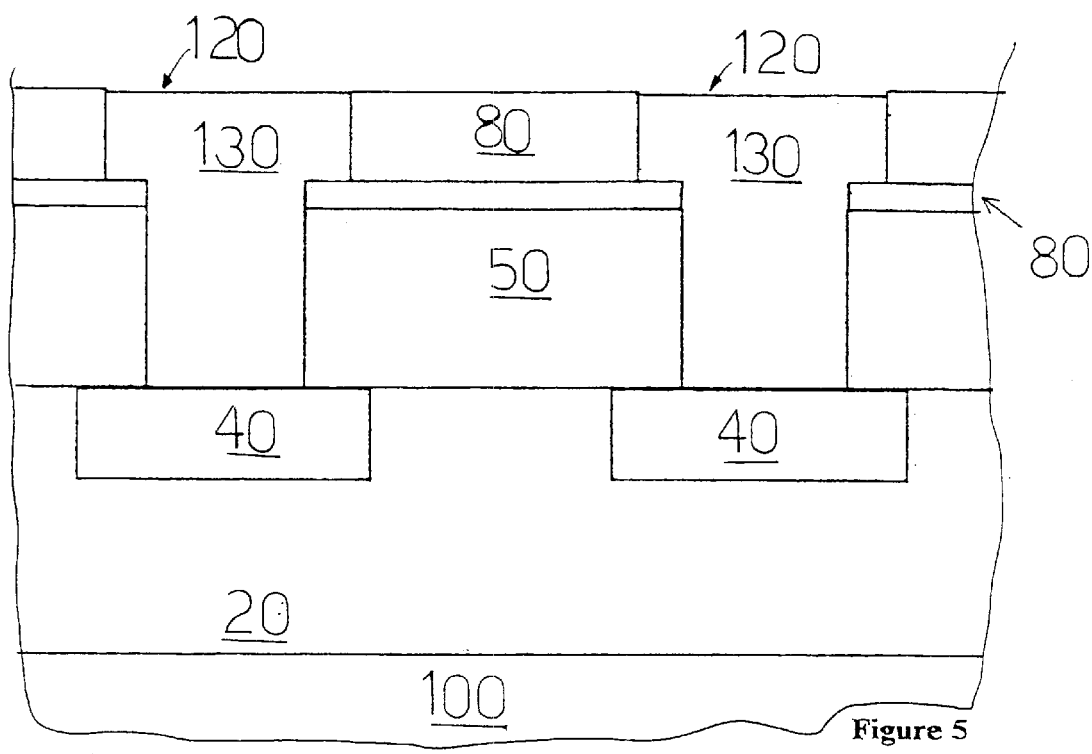
Figure 6:
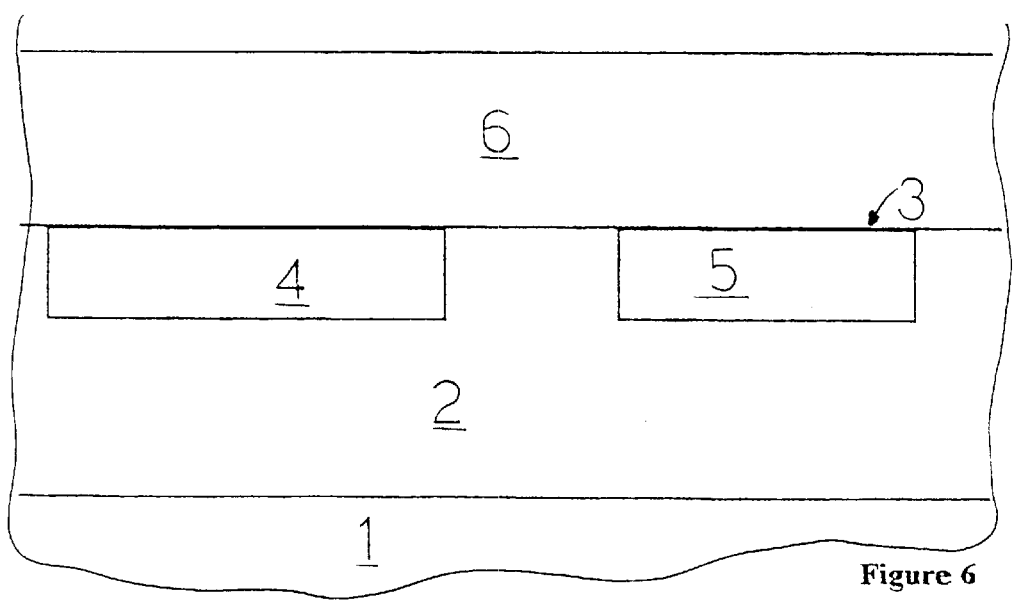
FIGS. 6–12 are vertical cross-sectional views schematically showing a portion of a semiconductor substrate wherein an interconnection structure has been formed according to an embodiment of the present invention.

PATENT NO.   : 6,503,823 B1
DATED        : January 7, 2003
INVENTOR(S)  : Sebastiano Ravesi It is certified that error appears in the above-identified patent and that said Letters Patent is hereby corrected as shown below:

Sheet 3 of 6, delete "FIG. 5" insert:

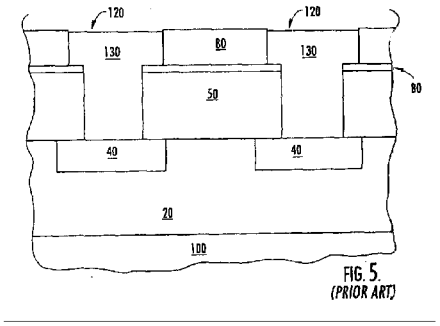

Signed and Sealed this

Ninth Day of March, 2004

JON W. DUDAS
*Acting Director of the United States Patent and Trademark Office*